(12) United States Patent
Amirkhany et al.

(10) Patent No.: US 9,960,774 B2
(45) Date of Patent: May 1, 2018

(54) SPREAD SPECTRUM CLOCKING PHASE ERROR CANCELLATION FOR ANALOG CDR/PLL

(71) Applicant: Samsung Display Co., Ltd., Yongin-si, Gyeonggi-do (KR)

(72) Inventors: Amir Amirkhany, Sunnyvale, CA (US); Ashkan Roshan Zamir, College Station, TX (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/256,444

(22) Filed: Sep. 2, 2016

(65) Prior Publication Data

US 2018/0013434 A1 Jan. 11, 2018

Related U.S. Application Data

(60) Provisional application No. 62/359,660, filed on Jul. 7, 2016.

(51) Int. Cl.
*H04B 3/46* (2015.01)
*H03L 7/08* (2006.01)
(Continued)

(52) U.S. Cl.
CPC .......... *H03L 7/0807* (2013.01); *H03L 7/0891* (2013.01); *H03L 7/093* (2013.01); *H03L 7/099* (2013.01); *H04L 47/29* (2013.01)

(58) Field of Classification Search
CPC ........ H04B 1/707; H04B 1/69; H04B 1/7075; H04B 3/46; H04B 17/0042; H04B 17/004;
(Continued)

(56) References Cited

U.S. PATENT DOCUMENTS 7,336,754 B2 2/2008 Aoyama
7,742,556 B1 6/2010 Qian et al.
(Continued)

OTHER PUBLICATIONS

Hsieh, Ming-ta, et al., "Architectures for Multi-Gigabit Wire-Linked Clock and Data Recovery", IEEE Circuits and Systems Magazine, 4th Quarter 2008, pp. 45-57.
(Continued)

*Primary Examiner* — Zewdu Kassa
(74) *Attorney, Agent, or Firm* — Lewis Roca Rothgerber Christie LLP

(57) ABSTRACT

A system and method for correcting for phase errors, in a phase locked loop, resulting from spread spectrum clocking involving a reference clock signal having a frequency modulation. A correction generation circuit generates an offset signal, that when injected after the charge pump of the phase locked loop, causes the voltage controlled oscillator to produce a signal with substantially the same frequency modulation, thereby reducing the phase error. The correction generation circuit may include a timing estimation circuit for estimating the times at which transitions (between positive-sloping and negative-sloping portions of the triangle wave) occur, and an amplitude estimation circuit for estimating the amplitude of the offset signal that results in a reduction in the phase error.

20 Claims, 5 Drawing Sheets

(51) Int. Cl.
*H03L 7/099* (2006.01)
*H03L 7/089* (2006.01)
*H03L 7/093* (2006.01)
*H04L 12/801* (2013.01)

(58) Field of Classification Search
CPC .......... H04B 3/462; H04J 13/10; H04J 13/00; H04L 1/20; H04L 1/24; H04L 1/205; H04L 1/206; G01R 31/31709; G01R 29/26
USPC ................ 375/226, 224, 219, 316, 295, 130
See application file for complete search history.

(56) References Cited

U.S. PATENT DOCUMENTS

| | | | |
|---|---|---|---|
| 7,961,830 B2 | 6/2011 | Okamura et al. | |
| 8,045,666 B2 | 10/2011 | Balraj et al. | |
| 8,634,510 B2 | 1/2014 | Kong et al. | |
| 8,666,013 B1 | 3/2014 | Khor et al. | |
| 8,681,914 B2 | 3/2014 | Sutioso et al. | |
| 8,687,756 B2 | 4/2014 | Sindalovsky et al. | |
| 8,923,467 B2 | 12/2014 | Lee et al. | |
| 8,958,515 B2 | 2/2015 | Cal et al. | |
| 9,036,764 B1 | 5/2015 | Hossain et al. | |
| 9,065,601 B1 | 6/2015 | Jenkins et al. | |
| 9,071,415 B2 | 6/2015 | Takeuchi | |
| 2007/0223639 A1* | 9/2007 | Unterricker | H03L 7/081 375/376 |
| 2012/0200324 A1 | 8/2012 | Wang | |
| 2014/0327477 A1* | 11/2014 | Chiang | H03L 7/08 327/156 |

OTHER PUBLICATIONS

Lee, Hae-Chang, "An Estimation Approach to Clock and Data Recovery", A Dissertation, Nov. 2006 (122 pages).

Khor, C,T., et al., "Adaptive Spread Spectrum Clock Tracking for Interpolar-based Clock and Data Recovery", 2011 International Symposium on Integrated Circuits, pp. 348-351.

* cited by examiner

SPREAD SPECTRUM CLOCKING PHASE ERROR CANCELLATION FOR ANALOG CDR/PLL

CROSS-REFERENCE TO RELATED APPLICATION(S)

The present application claims priority to and the benefit of U.S. Provisional Application No. 62/359,660, filed Jul. 7, 2016, entitled "SSC PHASE ERROR CANCELLATION FOR ANALOG CDR/PLL", the entire content of which is incorporated herein by reference.

FIELD

One or more aspects of embodiments according to the present invention relate to digital transmission of data, and more particularly to a system and method for reducing phase errors, in an analog clock and data recovery circuit and phase locked loop, when spread spectrum clocking is employed.

BACKGROUND

In high-speed electrical links, spread spectrum clocking (SSC) may be employed to reduce electromagnetic interference. Spread spectrum clocking may, for example, modulate the clock frequency with a triangular waveform, e.g., apply a triangle wave frequency modulation to the clock signal. The frequency ramp corresponding to a half cycle of the triangle wave may result in a phase error that is approximately constant if a second order phase-locked loop (PLL) is employed to track the clock signal. This phase error may reduce timing margins in the system.

Dual loop semi-digital phase-locked loops, which may be employed to reduce this phase error, may have various drawbacks. Such a phase locked loop may employ additional phase interpolators, digital to analog converters, and adaptation loops to estimate the frequency ramp rate and transition points of the triangle wave. Using dual loop semi-digital phase-locked loops may also be quite costly in terms of power; especially in double data rate or quad data rate systems which employ multiple phases of clock.

Thus, there is a need for an improved system and method for locking to a frequency modulated reference clock signal.

SUMMARY

Aspects of embodiments of the present disclosure are directed toward a system and method for correcting for phase errors, in a phase locked loop, resulting from spread spectrum clocking that involve a reference clock signal having a frequency modulation. A correction generation circuit generates an offset signal, that when injected after the charge pump of the phase locked loop, causes the voltage controlled oscillator to produce a signal with substantially the same frequency modulation, thereby reducing the phase error. The correction generation circuit may include a timing estimation circuit for estimating the times at which transitions (between positive-sloping and negative-sloping portions of the triangle wave) occur, and an amplitude estimation circuit for estimating the amplitude of the offset signal that results in a reduction in the phase error.

According to an embodiment of the present invention there is provided a system for generating a local clock from a clock reference signal having triangle wave frequency modulation, the system including: a phase locked loop; and a phase error reducing circuit including: a timing estimation circuit to estimate a phase of a square wave offsetting signal for offsetting an effect of the frequency modulation; an amplitude estimation circuit to estimate an amplitude of the offsetting signal, and for generating the offsetting signal; and an offset injection circuit to inject the offsetting signal into the phase locked loop, the phase error reducing circuit being for reducing the effect of the frequency modulation on a phase error of the phase locked loop.

In one embodiment, the phase locked loop includes a charge pump having an output connected to a loop filter, and the offset injection circuit includes a current digital to analog converter configured to inject a current at the output of the charge pump.

In one embodiment, the timing estimation circuit includes: a counter; a time estimate register; and a slope switch having a digital output, the timing estimation circuit being configured to: toggle a value at the output of the slope switch; and reset the counter, when the counter reaches a value stored in the time estimate register.

In one embodiment, the phase locked loop includes a voltage controlled oscillator having an output, and the amplitude estimation circuit includes: a bang-bang phase detector for comparing a phase of the clock reference to a phase of the output of the voltage controlled oscillator; a first accumulator for accumulating an output signal from the bang-bang phase detector during positive-valued portions of the offsetting signal; and a second accumulator for accumulating the output signal from the bang-bang phase detector during negative-valued portions of the offsetting signal.

In one embodiment, the amplitude estimation circuit further includes: a demultiplexer, controlled by the output of the slope switch, to connect the output of the bang-bang phase detector to either the first accumulator or the second accumulator; and a multiplexer, controlled by the output of the slope switch, to connect either the first accumulator or the second accumulator to the offset injection circuit.

In one embodiment, the timing estimation circuit further includes an averaging block to average the output of the bang-bang phase detector over an interval of time to form an average phase error value, and wherein the timing estimation circuit is further configured: to increment the value of the time estimate register when the average phase error value is greater than a positive threshold; and to decrement the value of the time estimate register when the average phase error value is less than a negative threshold.

In one embodiment, the system includes a slew rate limiting filter, connected between the multiplexer and the current digital to analog converter.

In one embodiment, the slew rate limiting filter is a digital filter.

In one embodiment, the slew rate limiting filter is bank of analog filters.

According to an embodiment of the present invention there is provided a method for generating a local clock from a clock reference signal having frequency modulation, the frequency modulation being a triangle wave as a function of time, the method including: forming a phase error signal proportional to a difference between a phase of the clock reference signal and a phase of an output of a voltage controlled oscillator; forming a current, from a charge pump, proportional to the phase error; forming an offset current by: estimating an amplitude and estimating a phase of a square wave signal proportional to a time derivative of the triangle wave; generating a square wave signal having the amplitude and phase; and providing the square wave signal to a current digital to analog converter; adding the offset current to the current from the charge pump to form a total current; and filtering the total current with a loop filter to form a control signal for the voltage controlled oscillator.

In one embodiment, the estimating of the phase of the square wave signal includes toggling a digital output of a slope switch to form a transition in the square wave signal and resetting a counter, when the counter reaches a value equal to a value stored in a time estimate register.

In one embodiment, the estimating of the phase of the square wave signal further includes: comparing the phase of the clock reference signal and the phase of the output of the voltage controlled oscillator with a bang-bang phase detector to generate up pulses when the phase of the clock reference signal leads the phase of the output of the voltage controlled oscillator; averaging an output of the bang-bang phase detector over an interval of time to form an average phase difference; and incrementing the value in the time estimate register when the average phase difference exceeds a threshold.

In one embodiment, the estimating of the amplitude of the square wave signal includes accumulating, during a first portion of the square wave corresponding to a positive-sloping portion of the triangle wave, the output of the bang-bang phase detector, by a first accumulator coupled to the output of the bang-bang phase detector.

In one embodiment, the estimating of the amplitude of the square wave signal further includes accumulating, during a second portion of the square wave corresponding to a negative-sloping portion of the triangle wave the output of the bang-bang phase detector, by a second accumulator coupled to the output of the bang-bang phase detector.

According to an embodiment of the present invention there is provided a display including: a transmitter to transmit digital data and a clock reference signal having triangle wave frequency modulation; and a receiver, the receiver including a phase locked loop; and a phase error reducing circuit including: a timing estimation circuit to estimate a phase of a square wave offsetting signal for offsetting an effect of the frequency modulation; an amplitude estimation circuit to estimate an amplitude of the offsetting signal, and for generating the offsetting signal; and an offset injection circuit to inject the offsetting signal into the phase locked loop, the phase error reducing circuit being for reducing the effect of the frequency modulation on a phase error of the phase locked loop.

In one embodiment, the phase locked loop includes a charge pump having an output connected to a loop filter, and the offset injection circuit includes a current digital to analog converter configured to inject a current at the output of the charge pump.

In one embodiment, the timing estimation circuit includes: a counter; a time estimate register; and a slope switch having a digital output, the timing estimation circuit being configured to: toggle a value at the output of the slope switch; and reset the counter when the counter value reaches a value stored in the time estimate register.

In one embodiment, the phase locked loop includes a voltage controlled oscillator having an output, and the amplitude estimation circuit includes: a bang-bang phase detector for comparing a phase of the clock reference to a phase of the output of the voltage controlled oscillator; a first accumulator for accumulating an output signal from the bang-bang phase detector during positive-valued portions of the offsetting signal; and a second accumulator for accumulating the output signal from the bang-bang phase detector during negative-valued portions of the offsetting signal.

In one embodiment, the amplitude estimation circuit further includes: a demultiplexer, controlled by the output of the slope switch, to connect the output of the bang-bang phase detector to either the first accumulator or the second accumulator; and a multiplexer, controlled by the output of the slope switch, to connect either the first accumulator or the second accumulator to the offset injection circuit.

In one embodiment, the timing estimation circuit further includes an averaging block to average the output of the bang-bang phase detector over an interval of time to form an average phase error value, and wherein the timing estimation circuit is further configured: to increment the value of the time estimate register when the average phase error value is greater than a positive threshold; and to decrement the value of the time estimate register when the average phase error value is less than a negative threshold.

BRIEF DESCRIPTION OF THE DRAWINGS

These and other features and advantages of the present invention will be appreciated and understood with reference to the specification, claims, and appended drawings wherein:

DETAILED DESCRIPTION

Figure 1:
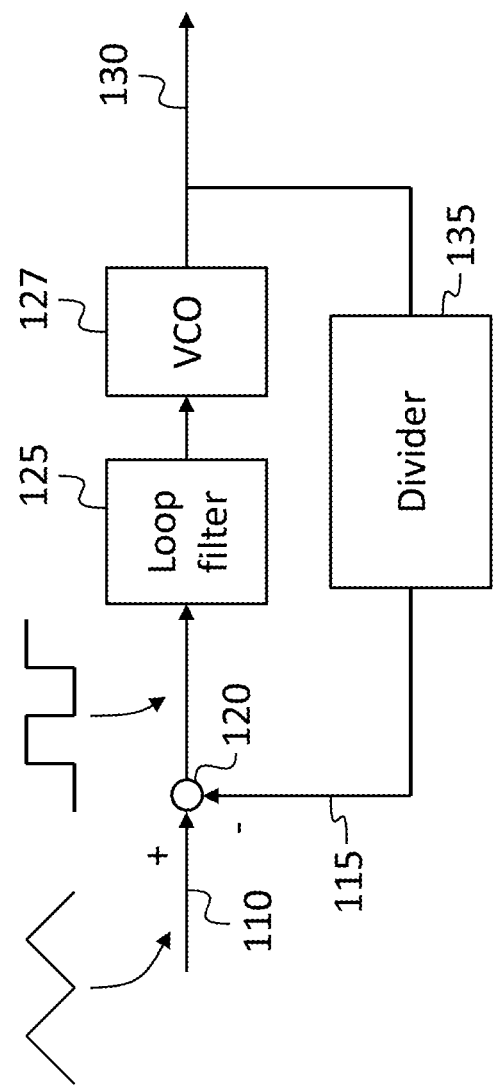
FIG. 1 is a block diagram of a phase locked loop, according to an embodiment of the present invention.

The detailed description set forth below in connection with the appended drawings is intended as a description of exemplary embodiments of a system and method for spread spectrum clocking phase error cancellation, for an analog clock and data recovery circuit including a phase locked loop, provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

A high speed electrical link for transmitting data from one circuit to another circuit may include a transmitter, a channel (consisting of or including, e.g., a plurality of conductors) and a receiver. The transmitter may include a clock (or "reference clock") that is used to time edges in data signals transmitted on the channel, and the reference clock signal itself may also be transmitted, forming a "forwarded clock" signal. Spread spectrum clocking (SSC) may be employed to broaden the spectral peaks of the reference clock signal, which may reduce electromagnetic interference. In some embodiments, this is implemented by using, in the transmitter, a reference clock that, instead of operating at a constant frequency, produces a frequency modulated signal, with the frequency having the shape of a triangle wave as a function of time. The frequency modulation may have an amplitude of 0.5% to 1.5% (i.e., the frequency may change, over time, by the corresponding fraction, as a result of the frequency modulation) and the triangle wave may have a frequency in the range of 30 kHz to 33 kHz. The receiver may include a phase locked loop that receives the forwarded clock signal and generates a local clock that is then used within the receiver, e.g., to sample the data signals also received by the receiver. This triangular frequency shape may consist, in each period of the frequency modulation, of two consecutive frequency ramps with opposite signs. Such constant slope frequency ramps (i.e., intervals of time in which the frequency of the forwarded clock changes at a constant rate) may result, in a second order phase-locked loop, in a constant final phase error. Over multiple periods of the triangular phase modulation, this may result in a phase error shaped as a square wave that alternates between a positive and negative value. This square wave phase error may reduce the timing margin of the clock and data recovery circuit and may result in an increase in bit error rate for the whole system.

In some embodiments the bandwidth of the phase locked loop may be increased to reduce the periodic phase error, but this approach may also result in higher jitter bandwidth and therefore an increase in system jitter, which too may reduce the timing margin of the system. In some embodiments the order of the system may be increased to three, which may avoid the presence of a constant final phase error within each half-cycle of the triangle wave, but transient phase errors at the transition points of the triangle wave may show little or no improvement.

In some embodiments, a spread spectrum clocking phase error cancellation system and method is integrated into an analog clock and data recovery circuit including a phase locked loop. The spread spectrum clocking phase error cancellation system includes a current digital to analog converter (a current DAC), a bang-bang phase detector and a low-speed adaptation loop. An estimation technique is used to extract spread spectrum clocking amplitude and timing to correct for spread spectrum clocking phase error by injecting current into the loop.

Referring to FIG. 1, in one embodiment a phase locked loop receives, at a reference clock input 110, a reference clock signal, and forms a phase error, in a phase comparator 120, by comparing the phase of the reference clock signal to that of a divided local clock signal 115. The phase error is filtered by a loop filter 125, the output of which controls a voltage controlled oscillator 127 to form a local or "reconstructed" clock 130. The local clock may have a higher frequency than the forwarded clock. A frequency divider 135 may be used to divide the frequency of the local clock, to form the divided local clock signal 115. In this system, if the phase locked loop is a second-order loop and if the spread spectrum clocking frequency modulation is a triangle wave as shown, then the resulting phase error may be (or may approximate) a square wave, as shown.

Figure 2:
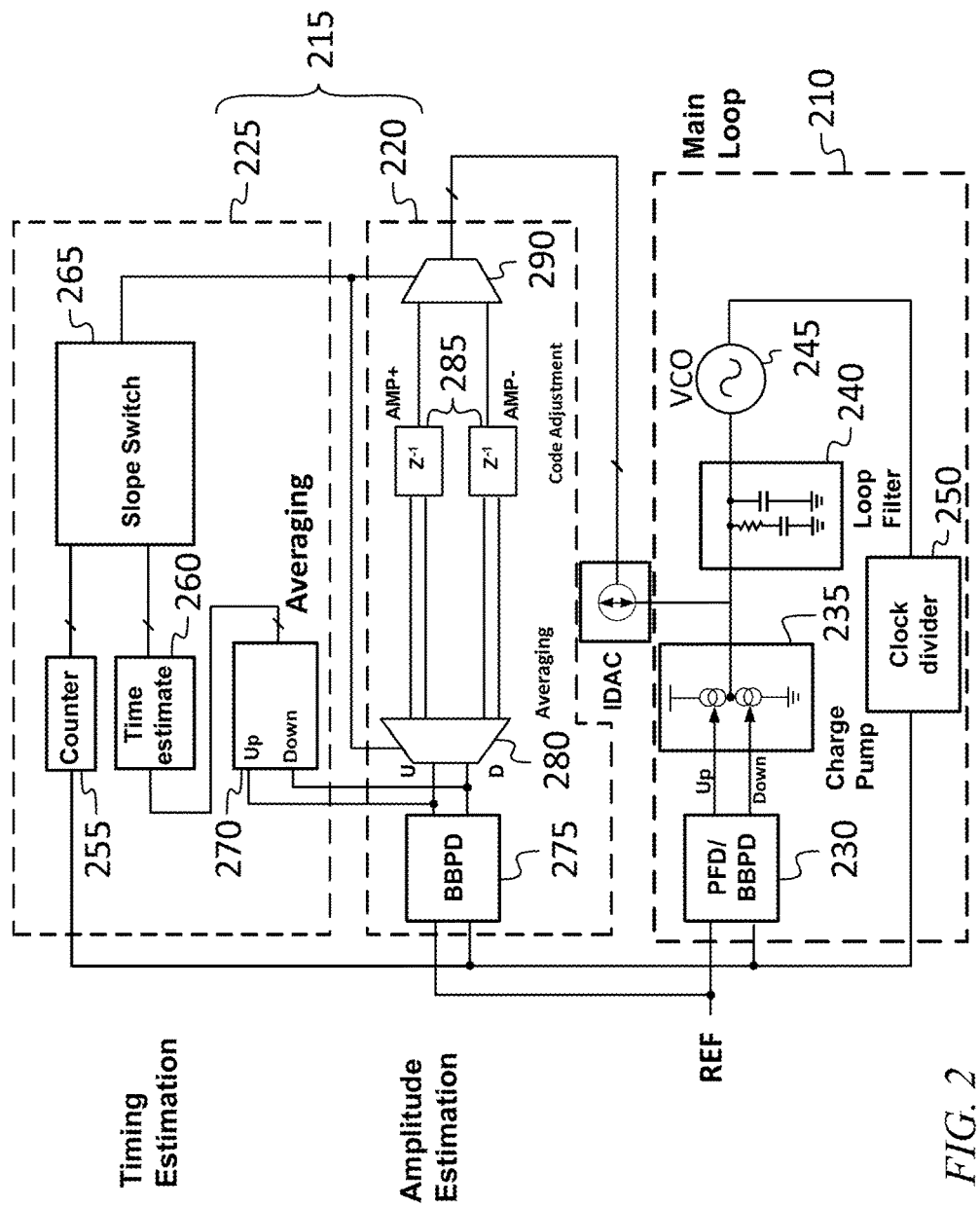
FIG. 2 is a block diagram of a phase locked loop with a system for cancelling phase errors due to spread spectrum clocking, according to an embodiment of the present invention.

Referring to FIG. 2, in one embodiment a system for generating a local clock includes a main phase locked loop 210 and a correction generation circuit 215 including an amplitude estimation circuit 220 and a timing estimation circuit 225. The correction generation circuit 215 may generate a square wave that alternates between two values, with each transition between the two values coinciding with a slope transition of the frequency modulation triangle wave. The correction generation circuit 215 may feed an offset injection circuit (e.g., the current DAC (IDAC)), which may inject a time-varying offset signal into the phase locked loop, to reduce the effect of the frequency modulation on the phase error. The correction generation circuit 215 and the offset injection circuit may together form a phase error reducing circuit that reduces the phase error in the main phase locked loop 210.

The phase locked loop 210 includes a phase and frequency detector (PFD) which may be a bang-bang phase detector (BBPD) 230, a charge pump 235, a loop filter 240, a voltage controlled oscillator 245, and a clock divider 250. The output of the bang-bang phase detector may be an "up" pulse, a "down" pulse (or, equivalently, a value of +1 or of −1), or no pulse, depending on whether, e.g., the phase of the reference clock leads or lags the phase of the VCO output. The output of the bang-bang phase detector may include more than one conductor (as shown in FIG. 2), e.g., one conductor to carry up pulses and another conductor to carry down pulses.

In operation, if the VCO substantially tracks the frequency modulated input, the control voltage at the input of the VCO approximates a triangle wave proportional to the frequency modulation of the reference clock signal. If the loop filter 240 is a simple integrator (i.e., different from the loop filter illustrated), then for the output of the loop filter to be a triangle wave, the input to the loop filter (e.g., the current generated by the charge pump) is a time-derivative of a triangle wave, i.e., a square wave. If the loop filter 240 includes an additional pole and zero (e.g., as for the circuit illustrated in FIG. 2), the loop filter input corresponding to a triangle wave frequency modulated signal at the output of voltage controlled oscillator may be a waveform approximating a square wave.

In the absence of the offset injection circuit, the phase error may approximate a square wave, resulting in a charge pump output current waveform that approximates a square wave, and a voltage controlled oscillator output that is frequency modulated with a waveform approximating a triangle wave.

If a similar square-wave current is instead injected at the output of the charge pump 235 (i.e., at the input of the loop filter 240) by the offset injection circuit, then the current supplied by the charge pump may be correspondingly smaller, for the same tracking accuracy at the output of the voltage controlled oscillator. In some embodiments, the correction generation circuit 215 provides a signal to the IDAC that results in the injection of such a square wave current.

In some embodiments, the timing estimation circuit 225 estimates whether the frequency modulation triangle wave is on an upslope or a downslope. The timing estimation circuit 225 estimates the length of the upslope and downslope by logging the output of a bang-bang phase detector and computing an average time between slope transitions. The timing estimation circuit 225 operates as a second phase locked loop that generates a square wave phase locked to the frequency modulation triangle wave, i.e., a square wave that alternates between two values, with each transition between the two values coinciding with a corner of the frequency modulation triangle wave. In the timing estimation circuit 225, a counter 255 counts the clock cycles outputted by the divided VCO output until its value is equal to the value stored in a time estimate register 260. When this value is reached (signaling a slope direction switch), the slope switch 265, which has a binary output, toggles its output to the other value (i.e., the output changes to binary 1 if it was binary 0, and it changes to binary 0 if it was binary 1), and the counter is reset to zero. In this manner, the period of the square wave generated by the timing estimation circuit 225 is twice (in units of the clock feeding the counter 255) the value of the time estimate register 260. Accordingly, the combination of the counter 255, the slope switch 265, and the time estimate register 260 functions as a circuit that is analogous to a voltage controlled oscillator; this combination of components generates a square wave having a frequency controlled by (proportional to the reciprocal of) the value of the time estimate register 260.

An averaging block 270 connected to a bang-bang phase detector 275 (in the amplitude estimation circuit 220) may periodically adjust the value of the time estimate register 260, to control the frequency and phase of the square wave to match the frequency and phase of the triangle wave. The averaging block 270 may average together (e.g., with a moving average filter) a number of successive output values (e.g., 64 such values or 1024 such values) and compare the average (which may be a fixed-point number) to a positive threshold and a negative threshold. If the average exceeds the positive threshold, the averaging block 270 may increment the value in the time estimate register 260; if the average is less than the negative threshold, the averaging block 270 may decrement the value in the time estimate register 260. The averaging block 270 may be disabled except during time intervals near slope transitions (e.g., near estimated slope transitions, corresponding to points in time at which the slope switch 265 toggles).

As such, the timing estimation circuit 225 operates, as mentioned above, as part of a phase locked loop, regulating the frequency and phase of the square wave output it generates. If the phase of the square wave leads the phase of the triangle wave, then on average the output of the bang-bang phase detector 275 may be positive, which results in incrementing the value in the time estimate register 260, which in turn decreases the frequency of the square wave. Conversely, if the phase of the square wave lags the phase of the triangle wave, then on average the output of the bang-bang phase detector 275 may be negative, which results in decrementing the value in the time estimate register 260, which in turn increases the frequency of the square wave.

The amplitude estimation circuit 220 estimates the amplitude of the square wave current that, when injected into the phase locked loop 210, will cause the VCO to substantially track the frequency modulation triangle wave. The amplitude estimation circuit 220 also generates an offsetting signal for offsetting the effect of the frequency modulation. The offsetting signal is a square wave signal, proportional to the square wave current, which is fed to the current analog to digital converter (IDAC). The amplitude estimation circuit 220 includes the bang-bang phase detector 275, a demultiplexer 280, two accumulators 285, and a multiplexer 290. During a first half-cycle of the square wave (corresponding, e.g., to an up-sloping portion of the frequency modulation triangle wave, during which the frequency is increasing), during which the output of the slope switch 265 takes a first value (e.g., binary 1), both the demultiplexer 280 and the multiplexer 290 may select their respective upper branches, so that the value of the upper accumulator 285 ("AMP+") is incremented when the bang-bang phase detector 275 produces an up pulse ("U") and is decremented when the bang-bang phase detector 275 produces a down pulse ("D"). Equivalently, each up pulse may be considered to be an output value of +1 from the bang-bang phase detector 275, each down pulse may be considered to be an output value of –1 from the bang-bang phase detector 275, and the accumulator may be a block that adds each new value received to a register, so that the register value is equal to the number of up pulses received less the number of down pulses received.

The output of the amplitude estimation circuit 220 may control the current injected at the output of the charge pump by the current analog to digital converter (IDAC). During the up-sloping portion of the frequency modulation triangle wave, if the magnitude of the injected current is too small (i.e., if a larger injected current would further decrease the phase error), then the output of the bang-bang phase detector 275 may include a plurality of up pulses, causing the value of the upper one of the accumulators 285 (i.e., the "AMP+" accumulator) to be increased, which in turn may result in a larger current being injected during up-sloping portion of the frequency modulation triangle wave. Conversely, if the magnitude of the injected current is too large (i.e., if a smaller injected current would decrease the phase error), then the output of the bang-bang phase detector 275 may include a plurality of down pulses, causing the value of the upper one of the accumulators 285 to be decreased, which in turn may result in a smaller current being injected during up-sloping portion of the frequency modulation triangle wave.

The amplitude estimation circuit 220 may operate in an analogous manner during down-sloping portions of the frequency modulation triangle wave, during which the injected current may be negative. For example, if the magnitude of the injected current is too small (i.e., if a negative injected current of greater magnitude would further decrease the phase error), then the output of the bang-bang phase detector 275 may include a plurality of down pulses, causing the value of the lower one of the accumulators 285 (i.e., the "AMP–" accumulator) to be decreased (to take a negative value of larger magnitude), which in turn may result in a larger negative current being injected during down-sloping portion of the frequency modulation triangle wave. Conversely, if the magnitude of the injected current is too large (i.e., if a negative injected current of smaller magnitude would decrease the phase error), then the output of the bang-bang phase detector 275 may include a plurality of up pulses, causing the value of the lower one of the accumulators 285 to be increased, which in turn may result in a smaller magnitude (negative) current being injected during down-sloping portion of the frequency modulation triangle wave. In each case, i.e., during the up-sloping portions of the frequency modulation triangle wave and during the down-sloping portions of the frequency modulation triangle wave, the multiplexer 290 selects the appropriate accumulator 285 and sends its output to the IDAC. It will be understood that assumptions about the signs of signals and gains is arbitrary in the above examples, and that any sign may be changed, if another offsetting sign change is made elsewhere in the loop.

Figure 3:
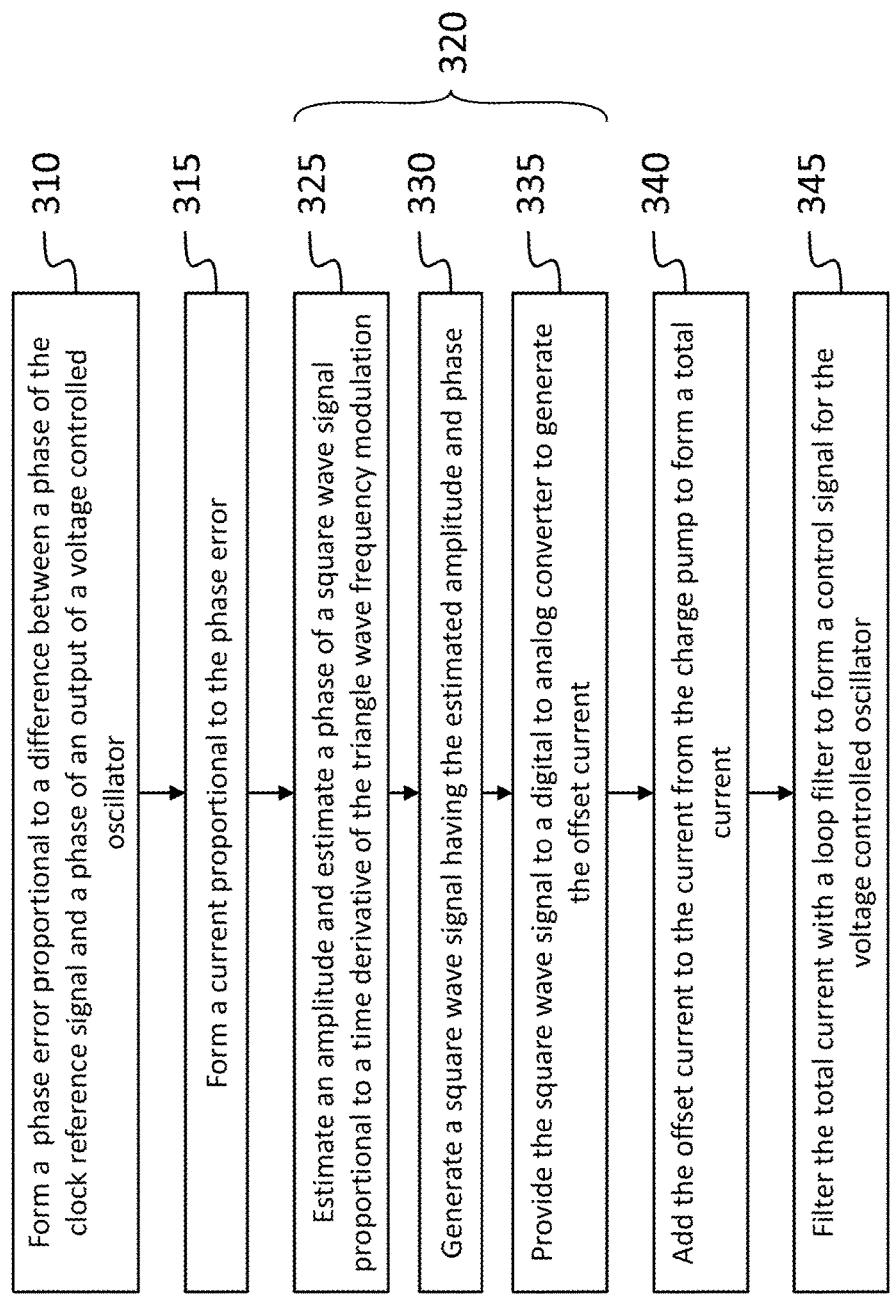
FIG. 3 is a flow chart illustrating a method for cancelling phase errors due to spread spectrum clocking, according to an embodiment of the present invention.
Figure 4:
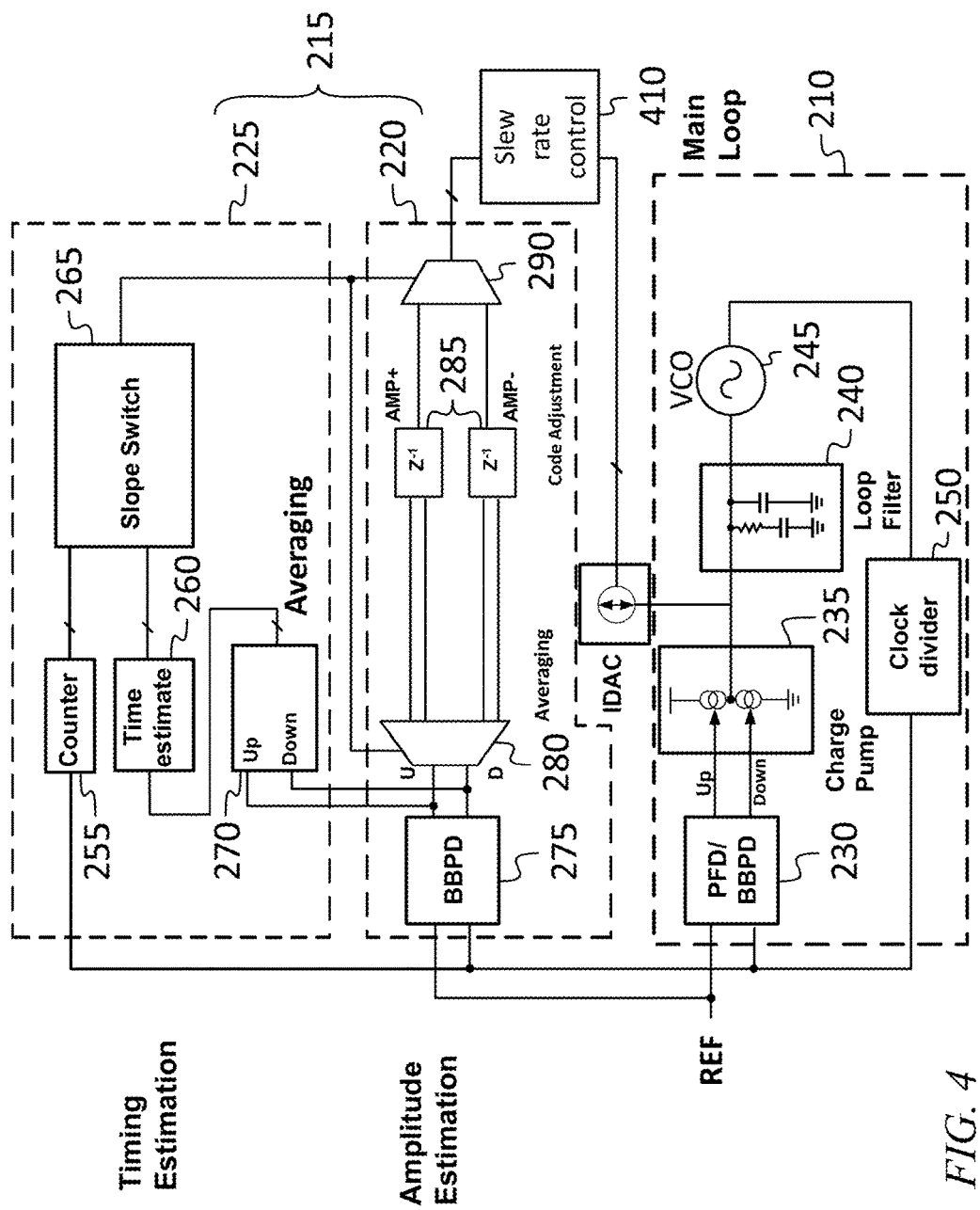
FIG. 4 is a block diagram of a phase locked loop with a system for cancelling phase errors due to spread spectrum clocking, according to an embodiment of the present invention.

Referring to FIG. 3, in one embodiment a method for canceling phase errors due to spread spectrum clocking includes, in an act 310, forming a phase error signal proportional to a difference between a phase of the clock reference signal and a phase of an output of a voltage controlled oscillator, and, in an act 315, forming a current proportional to the phase error. The phase error signal may be formed (in the act 310) by a bang-bang phase detector 275 (FIG. 2), and the forming (in the act 315) of the current proportional to the phase error may be performed, for example, by a charge pump 235 (FIG. 2). The method further includes, and in an act 320, forming an offset current. The forming of the offset current (in the act 320) may include, in an act 325, estimating an amplitude and estimating a phase of a square wave signal proportional to a time derivative of the triangle wave; generating, in an act 330, a square wave signal having the estimated amplitude and phase; and providing, in an act 335, the square wave signal to a current digital to analog converter to generate the offset current. The method may further include adding, in an act 340, the offset current to the current from the charge pump to form a total current; and filtering, in an act 345, the total current with a loop filter to form a control signal for the voltage controlled oscillator.

In some embodiments enhancements to the circuit of FIG. 2 may result in improved performance. For example, e.g., because the loop filter 240 may have a frequency response differing from that of a simple integrator, performance improvements may be achieved by connecting a slew rate control filter (e.g., a low-pass filter) 410 between the output of the multiplexer 290 and the input of the IDAC, as shown in FIG. 3. This filter 410 may be a digital filter (e.g., a finite impulse response (FIR) filter or an infinite impulse response (IIR) filter), or it may be an analog filter, or a bank of analog filters, e.g., if the output of the amplitude estimation circuit 220 is a digital word employing unary coding or "thermometer code".

In some embodiments if the IDAC resolution is sufficiently coarse to result in a significant residual phase error, this source of phase error may be mitigated by sampling the phase error within the constant slope regions (i.e., away from the transitions of the frequency modulation triangle wave), and subtracting this sampled phase error from the phase error sampled near the transitions (e.g., during transient changes in phase error occurring immediately after a transition).

Figure 5:
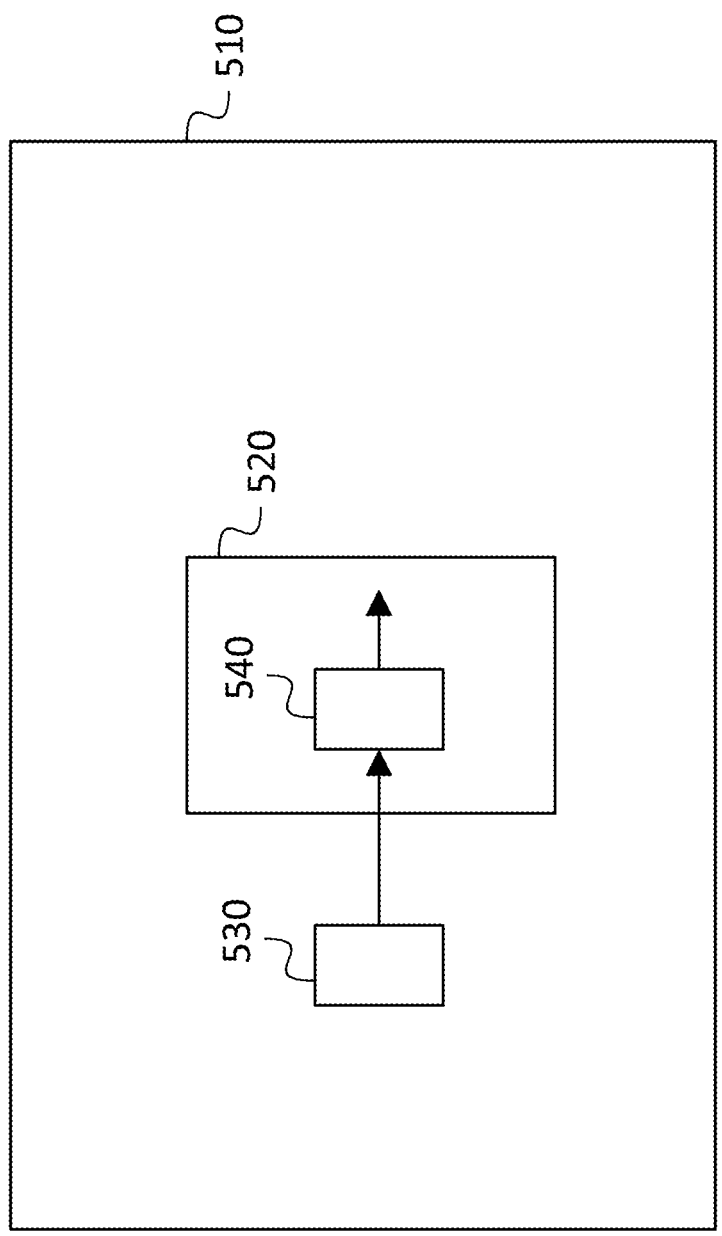
FIG. 5 is a block diagram of a display including a phase locked loop with a system for cancelling phase errors due to spread spectrum clocking, according to an embodiment of the present invention.

Referring to FIG. 5, in one embodiment a display 510 includes a timing controller (TCON) 530 including a transmitter, and a driver integrated circuit (DIC) 520 including a receiver including a PLL 540 with a system and method for SSC phase error cancellation according to an embodiment of the present invention.

In light of the foregoing, a system and method for correcting for phase errors, in a phase locked loop, resulting from spread spectrum clocking involving a clock signal having a frequency modulation may be constructed according to embodiments described above. A correction generation circuit generates an offset signal that when injected after the charge pump of the phase locked loop, causes the voltage controlled oscillator to produce a signal with substantially the same frequency modulation, thereby reducing the phase error that otherwise would produce a similar frequency modulation at the voltage controlled oscillator. The correction generation circuit may include a timing estimation circuit for estimating the times at which transitions (between positive-slope and negative-slope portions of the triangle wave) occur, and an amplitude estimation circuit for estimating the amplitude of the offset signal that results in a reduction in the phase error.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a system and method for spread spectrum clocking phase error cancellation, for an analog clock and data recovery circuit including a phase locked loop, have been specifically described and illustrated herein, many modifications and variations will be apparent to those skilled in the art. Accordingly, it is to be understood that a system and method for spread spectrum clocking phase error cancellation, for an analog clock and data recovery circuit including a phase locked loop, constructed according to principles of this invention may be embodied other than as specifically described herein. The invention is also defined in the following claims, and equivalents thereof.

What is claimed is:

1. A system for generating a local clock from a clock reference signal, the system comprising:
   a phase locked loop; and
   a phase error reducing circuit comprising:
      a timing estimation circuit to estimate a phase of a square wave offsetting signal for offsetting an effect of a triangle wave frequency modulation in the clock reference signal;
      an amplitude estimation circuit to estimate an amplitude of the offsetting signal, and for generating the offsetting signal; and
      an offset injection circuit to inject the offsetting signal into the phase locked loop,
   the phase error reducing circuit being for reducing the effect of the frequency modulation on a phase error of the phase locked loop.

2. The system of claim 1, wherein the phase locked loop comprises a charge pump having an output connected to a loop filter, and the offset injection circuit comprises a current digital to analog converter configured to inject a current at the output of the charge pump.

3. The system of claim 2, wherein the timing estimation circuit comprises:
   a counter;
   a time estimate register; and
   a slope switch having a digital output,
   the timing estimation circuit being configured to:
      toggle a value at the output of the slope switch; and
      reset the counter,
      when the counter reaches a value stored in the time estimate register.

4. The system of claim 3, wherein the phase locked loop comprises a voltage controlled oscillator having an output, and the amplitude estimation circuit comprises:
   a bang-bang phase detector for comparing a phase of the clock reference signal to a phase of the output of the voltage controlled oscillator;
   a first accumulator for accumulating an output signal from the bang-bang phase detector during positive-valued portions of the offsetting signal; and
   a second accumulator for accumulating the output signal from the bang-bang phase detector during negative-valued portions of the offsetting signal.

5. The system of claim 4, wherein the amplitude estimation circuit further comprises:
   a demultiplexer, controlled by the output of the slope switch, to connect the output of the bang-bang phase detector to either the first accumulator or the second accumulator; and
   a multiplexer, controlled by the output of the slope switch, to connect either the first accumulator or the second accumulator to the offset injection circuit.

6. The system of claim 5, wherein the timing estimation circuit further comprises an averaging block to average the output of the bang-bang phase detector over an interval of time to form an average phase error value, and
   wherein the timing estimation circuit is further configured:
      to increment the value of the time estimate register when the average phase error value is greater than a positive threshold; and
      to decrement the value of the time estimate register when the average phase error value is less than a negative threshold.

7. The system of claim 6, further comprising a slew rate limiting filter, connected between the multiplexer and the current digital to analog converter.

8. The system of claim 7, wherein the slew rate limiting filter is a digital filter.

9. The system of claim 7, wherein the slew rate limiting filter is bank of analog filters.

10. A method for generating a local clock from a clock reference signal, the method comprising:
    forming a phase error signal proportional to a difference between a phase of the clock reference signal and a phase of an output of a voltage controlled oscillator;
    forming a current, from a charge pump, proportional to the phase error signal;
    forming an offset current by:
       estimating an amplitude and estimating a phase of a square wave signal proportional to a time derivative of a triangle wave frequency modulation in the clock reference signal;
       generating a square wave signal having the amplitude and phase; and
       providing the square wave signal to a current digital to analog converter;
    adding the offset current to the current from the charge pump to form a total current; and
    filtering the total current with a loop filter to form a control signal for the voltage controlled oscillator.

11. The method of claim 10, wherein the estimating of the phase of the square wave signal comprises toggling a digital output of a slope switch to form a transition in the square wave signal and resetting a counter, when the counter reaches a value equal to a value stored in a time estimate register.

12. The method of claim 11, wherein the estimating of the phase of the square wave signal further comprises:
    comparing the phase of the clock reference signal and the phase of the output of the voltage controlled oscillator with a bang-bang phase detector to generate up pulses when the phase of the clock reference signal leads the phase of the output of the voltage controlled oscillator;
    averaging an output of the bang-bang phase detector over an interval of time to form an average phase difference; and
    incrementing the value in the time estimate register when the average phase difference exceeds a threshold.

13. The method of claim 12, wherein the estimating of the amplitude of the square wave signal comprises accumulating, during a first portion of the square wave corresponding to a positive-sloping portion of the triangle wave, the output of the bang-bang phase detector, by a first accumulator coupled to the output of the bang-bang phase detector.

14. The method of claim 13, wherein the estimating of the amplitude of the square wave signal further comprises accumulating, during a second portion of the square wave corresponding to a negative-sloping portion of the triangle wave, the output of the bang-bang phase detector, by a second accumulator coupled to the output of the bang-bang phase detector.

15. A display comprising:
    a transmitter to transmit digital data and a clock reference signal; and
    a receiver,
    the receiver comprising
       a phase locked loop; and a phase error reducing circuit comprising:
   a timing estimation circuit to estimate a phase of a square wave offsetting signal for offsetting an effect of a triangle wave frequency modulation in the clock reference signal;
   an amplitude estimation circuit to estimate an amplitude of the offsetting signal, and for generating the offsetting signal; and
   an offset injection circuit to inject the offsetting signal into the phase locked loop,
the phase error reducing circuit being for reducing the effect of the frequency modulation on a phase error of the phase locked loop.

16. The display of claim 15, wherein the phase locked loop comprises a charge pump having an output connected to a loop filter, and the offset injection circuit comprises a current digital to analog converter configured to inject a current at the output of the charge pump.

17. The display of claim 16, wherein the timing estimation circuit comprises:
   a counter;
   a time estimate register; and
   a slope switch having a digital output,
   the timing estimation circuit being configured to:
      toggle a value at the output of the slope switch; and
      reset the counter
   when the counter value reaches a value stored in the time estimate register.

18. The display of claim 17, wherein the phase locked loop comprises a voltage controlled oscillator having an output, and the amplitude estimation circuit comprises:
   a bang-bang phase detector for comparing a phase of the clock reference to a phase of the output of the voltage controlled oscillator;
   a first accumulator for accumulating an output signal from the bang-bang phase detector during positive-valued portions of the offsetting signal; and
   a second accumulator for accumulating the output signal from the bang-bang phase detector during negative-valued portions of the offsetting signal.

19. The display of claim 18, wherein the amplitude estimation circuit further comprises;
   a demultiplexer, controlled by the output of the slope switch, to connect the output of the bang-bang phase detector to either the first accumulator or the second accumulator; and
   a multiplexer, controlled by the output of the slope switch, to connect either the first accumulator or the second accumulator to the offset injection circuit.

20. The display of claim 19, wherein the timing estimation circuit further comprises an averaging block to average the output of the bang-bang phase detector over an interval of time to form an average phase error value, and
   wherein the timing estimation circuit is further configured:
      to increment the value of the time estimate register when the average phase error value is greater than a positive threshold; and
      to decrement the value of the time estimate register when the average phase error value is less than a negative threshold.

* * * * *